(12) United States Patent
Engel et al.

(10) Patent No.: US 6,956,764 B2
(45) Date of Patent: Oct. 18, 2005

(54) METHOD OF WRITING TO A MULTI-STATE MAGNETIC RANDOM ACCESS MEMORY CELL

(75) Inventors: Bradley N. Engel, Chandler, AZ (US); Eric J. Salter, Scottsdale, AZ (US); Jon M. Slaughter, Tempe, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 104 days.

(21) Appl. No.: 10/647,976

(22) Filed: Aug. 25, 2003

(65) Prior Publication Data

US 2005/0047198 A1 Mar. 3, 2005

(51) Int. Cl.[7] .......................... G11C 11/00; G11C 11/14; G11C 11/15
(52) U.S. Cl. ....................... 365/158; 365/171; 365/173
(58) Field of Search ................................ 365/158, 171, 365/173, 185.03, 185.11

(56) References Cited

U.S. PATENT DOCUMENTS

| | | |
|---|---|---|
| 5,930,164 A | 7/1999 | Zhu |
| 5,953,248 A | 9/1999 | Chen et al. |
| 6,545,906 B1 | 4/2003 | Savtchenko et al. |
| 6,567,304 B1 * | 5/2003 | Kleveland ............... 365/185.03 |
| 6,580,638 B2 * | 6/2003 | Conley et al. ......... 365/185.11 |
| 6,714,440 B2 * | 3/2004 | Subramanian et al. ...... 365/158 |
| 6,842,365 B1 * | 1/2005 | Nahas et al. ................. 365/158 |

* cited by examiner

*Primary Examiner*—Trong Phan
(74) *Attorney, Agent, or Firm*—Robert L. King

(57) ABSTRACT

A method to switch a scalable magnetoresistive memory cell including the steps of providing a magnetoresistive memory device (12) having two bits (18) and (20) sandwiched between a word line (14) and a digit line (16) so that current waveforms (104) and (106) can be applied to the word and digit lines at various times to cause a magnetic field flux $H_W$ and $H_D$ to rotate the effective magnetic moment vectors (86) and (94) of the device (12) by approximately 180°. Each bit includes N ferromagnetic layers (32) and (34, 42) and (44, 60) and (62, 72 and 74) that are anti-ferromagnetically coupled. N can be adjusted to change the magnetic switching volume of the bit. One or both bits may be programmed by adjusting the current in the word and/or digit lines.

16 Claims, 4 Drawing Sheets

METHOD OF WRITING TO A MULTI-STATE MAGNETIC RANDOM ACCESS MEMORY CELL

FIELD OF INVENTION

The present invention generally relates to magnetic random access memory (MRAM) memory. More particularly, the present invention relates to a method for writing a multi-state MRAM cell.

BACKGROUND OF THE INVENTION

Non-volatile memory devices are an extremely important component in electronic systems. FLASH is the major non-volatile memory device in use today. Typical non-volatile memory devices use charges trapped in a floating oxide layer to store information. Disadvantages of FLASH memory include high voltage requirements and slow program and erase times. Also, FLASH memory has a poor write endurance of $10^4$–$10^6$ cycles before memory failure. In addition, to maintain reasonable data retention, the scaling of the gate oxide is restricted by the tunneling barrier seen by the electrons. Hence, FLASH memory is limited in the dimensions to which it can be scaled.

To overcome these shortcomings, magnetic memory devices are being evaluated. One such device is the MRAM cell. To be commercially practical, however, MRAM must have comparable memory density to current memory technologies, be scalable for future generations, operate at low voltages, have low power consumption, and have competitive read/write speeds.

For an MRAM device, the stability of the nonvolatile memory state, the repeatability of the read/write cycles, and the memory element-to-element switching field uniformity are three of the most important aspects of its design characteristics. A memory state in MRAM is not maintained by power, but rather by the direction of the magnetic moment vector. Storing data is accomplished by applying magnetic fields and causing a magnetic material in a MRAM device to be magnetized into either of two possible memory states. Recalling data is accomplished by sensing the resistive differences in the MRAM device between the two states. The magnetic fields for writing are created by passing currents through strip lines external to the magnetic structure or through the magnetic structures themselves.

As the lateral dimension of previously known MRAM devices decrease, three problems may occur. First, the switching field increases for a given shape and film thickness, requiring a larger magnetic field to switch. Second, the total switching volume is reduced so that the energy barrier for reversal decreases. The energy barrier refers to the amount of energy needed to switch the magnetic moment vector from one state to the other. The energy barrier determines the data retention and error rate of the MRAM device and unintended reversals can occur due to thermo fluctuations (superparamagnetism) if the barrier is too small. A major problem with having a small energy barrier is that it becomes extremely difficult to selectively switch one MRAM device in an array. Selectability allows switching without inadvertently switching other MRAM devices. Finally, because the switching field is produced by shape, the switching field becomes more sensitive to shape variations as the MRAM device decreases in size. With photolithography scaling becoming more difficult at smaller dimensions, MRAM devices will have difficulty maintaining tight switching distributions.

A novel method of writing to MRAM cells has been disclosed in U.S. Pat. No. 6,545,906 comprising a method to switch a scalable magnetoresistive memory cell including the steps of providing a magnetoresistive memory device sandwiched between a word line and a digit line so that current waveforms can be applied to the word and digit lines at various times to cause a magnetic field flux to rotate the effective magnetic moment vector of the device by approximately 180°. This method provides two different modes of state switching: a toggle write mode where the state of the bit is changed or toggled each time two field pulses of both the same polarity are applied, and a direct write mode where the state of the bit is directly switched to a state that is dependent on the polarity of both the applied field pulses.

In order to improve memory density at a larger bit size, multi-state, multi-layer magnetic memory cells with magnetically coupled magnetic layers have been developed. See for example, U.S. Pat. Nos. 5,953,248 and 5,930,164, which disclose a antiferromagnetically coupled multi-layer structure having first and second magnetoresistive layers with a non-magnetic conducting layer situated in parallel juxtaposition between the pair of magnetoresistive layers. The pair of magnetoresistive layers in the antiferromagnetically coupled multi-layer structure are constructed to switch at different magnetic fields, by having different thicknesses or different magnetic material. Also, the pair of magnetoresistive layers in the antiferromagnetically coupled multi-layer structure each have a magnetic vector which are anti-parallel with no applied magnetic field due to the antiferromagnetic coupling of the pair of layers and the aspect ratio. The cell further includes a magnetoresistive structure having a magnetic vector with a fixed relationship to the vector of the second magnetoresistive layer. Electrically insulating material is situated in parallel juxtaposition between the antiferromagnetically coupled multi-layer structure and the magnetoresistive structure to form a magnetic tunneling junction.

SUMMARY OF THE INVENTION

In various exemplary and representative aspects, one embodiment of the present invention provides a method of programming a memory cell having two bits positioned between two current conductors, comprising toggling the logic state of each bit separately. Another embodiment comprises toggling first and second bits so the first bit is in the desired state, then toggling the second bit to the desired state.

BRIEF DESCRIPTION OF THE DRAWINGS

FIG. 5 is a graph illustrating the timing diagram of the word and digit currents when both are turned on;

DETAILED DESCRIPTION OF EXEMPLARY EMBODIMENTS

Figure 1:
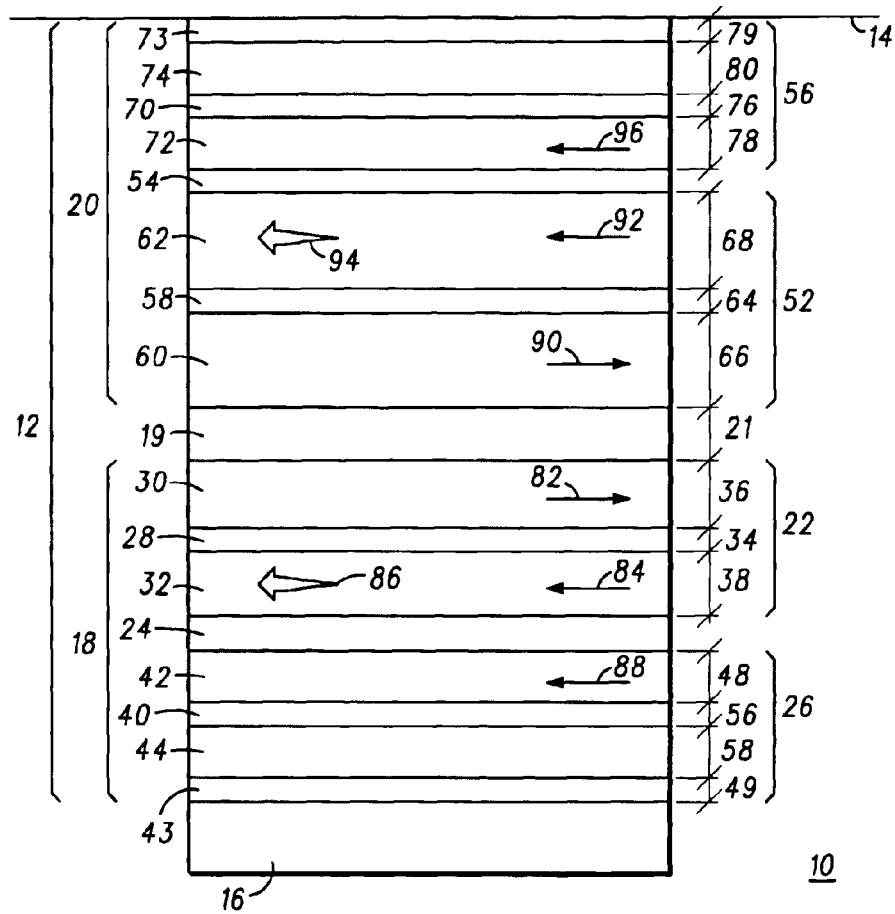
FIG. 1 is a simplified sectional view of a magnetoresistive random access memory device in accordance with a first embodiment.

Referring to FIG. 1, a simplified sectional view of a two bit MRAM device 10 illustrates a single magnetoresistive two bit memory device 12, but it will be understood that MRAM array 10 consists of a number of multi-bit MRAM devices 12 and only one such two bit device is shown for simplicity in describing the writing method.

Two bit MRAM device 12 is sandwiched between a word line 14 and a digit line 16. Word line 14 and digit line 16 include conductive material such that a current can be passed therethrough. In this illustration, word line 14 is positioned on top of MRAM device 12 and digit line 16 is positioned on the bottom of MRAM device 12 and is directed at a 90° angle to word line 14 (See FIG. 2).

MRAM device 12 includes first and second bits 18 and 20, separated by a conductive spacer 19 having a thickness 21. Bit 18 comprises a first magnetic region 22, a tunneling barrier 24, and a second magnetic region 26, wherein tunneling barrier 24 is sandwiched therebetween first magnetic region 22 and second magnetic region 26. In the preferred embodiment, magnetic region 22 comprises a tri-layer structure, which has an anti-ferromagnetic coupling spacer layer 28 sandwiched between two ferromagnetic layers 30 and 32. Anti-ferromagnetic coupling spacer layer 28 has a thickness 34 and ferromagnetic layers 30 and 32 have thicknesses 36 and 38, respectively. Further, magnetic region 26 comprises a multilayer structure, which has an anti-ferromagnetic coupling spacer layer 40 sandwiched between two ferromagnetic layers 42 and 44. A pinning layer 43 having a thickness 49 is positioned between the ferromagnetic layer 44 and the digit line 16. Anti-ferromagnetic coupling spacer layer 40 has a thickness 56 and ferromagnetic layers 42 and 44 have thicknesses 48 and 58, respectively.

Bit 20 comprises a third magnetic region 52, a tunneling barrier 54, and a fourth magnetic region 56, wherein tunneling barrier 54 is sandwiched between third magnetic region 52 and fourth magnetic region 56. In the preferred embodiment, magnetic region 52 comprises a tri-layer structure, which has an anti-ferromagnetic coupling spacer layer 58 sandwiched between two ferromagnetic layers 60 and 62. Anti-ferromagnetic coupling spacer layer 58 has a thickness 64 and ferromagnetic layers 60 and 62 have thicknesses 66 and 68, respectively. Further, magnetic region 56 comprises a multilayer structure, which has an anti-ferromagnetic coupling spacer layer 70 sandwiched between two ferromagnetic layers 72 and 74. Anti-ferromagnetic coupling spacer layer 70 has a thickness 76 and ferromagnetic layers 72 and 74 have thicknesses 78 and 80, respectively. A pinning layer 73 having a thickness 79 is positioned between the ferromagnetic layer 74 and the word line 14.

Typically, anti-ferromagnetic coupling spacer layers 28, 40, 58 and 70 include at least one of the elements Ru, Os, Re, Cr, Rh, Cu, or combinations thereof. Further, ferromagnetic layers 30, 32, 42, 44, 60, 62, 72, and 74 typically include at least one of elements Ni, Fe, Co, or combinations thereof. Also, it will be understood that magnetic regions 22, 26, 52 and 56 can include synthetic anti-ferromagnetic layer material structures having more layers than shown and the use of the number of layers shown in this embodiment is for illustrative purposes only.

Ferromagnetic layers 30 and 32 each have a magnetic moment vector 82 and 84, respectively, that are usually held anti-parallel by coupling of the anti-ferromagnetic coupling spacer layer 28. Also, magnetic region 22 has a resultant magnetic moment vector 86 and magnetic region 26 has a resultant magnetic moment vector 88. Resultant magnetic moment vectors 86 and 88 are oriented along an anisotropy easy-axis in a direction that is at an angle, preferably 45°, from word line 14 and digit line 16 (See FIG. 2). Further, magnetic region 22 is a free ferromagnetic region, meaning that resultant magnetic moment vector 86 is free to rotate in the presence of an applied magnetic field. Magnetic region 26 is a pinned ferromagnetic region, meaning that resultant magnetic moment vector 88 is not free to rotate in the presence of a moderate applied magnetic field and is used as the reference layer.

It should be understood that bit 20 operates in similar fashion to bit 18. For bit 20, ferromagnetic layers 60 and 62 each have a magnetic moment vector 90 and 92, respectively, that are usually held anti-parallel by coupling of the anti-ferromagnetic coupling spacer layer 58. Also, magnetic region 52 has a resultant magnetic moment vector 94 and magnetic region 56 has a resultant magnetic moment vector 96. Resultant magnetic moment vectors 94 and 96 are oriented along an anisotropy easy-axis in a direction that is at an angle, preferably 45°, from word line 14 and digit line 16 (See FIG. 2). Further, magnetic region 52 is a free ferromagnetic region, meaning that resultant magnetic moment vector 94 is free to rotate in the presence of an applied magnetic field. Magnetic region 56 is a pinned ferromagnetic region, meaning that resultant magnetic moment vector 96 is not free to rotate in the presence of a moderate applied magnetic field and is used as the reference layer.

While anti-ferromagnetic coupling layers 28 and 40 are illustrated between the two ferromagnetic layers 30, 32 and 42, 44, respectively, in each tri-layer structure 22 and 52 and each multilayer structure 26 and 56, it will be understood that the ferromagnetic layers 30, 32 and 42, 44 could be anti-ferromagnetically coupled through other means, such as magnetostatic fields or other features. For example, when the aspect ratio of a cell is reduced to five or less, the ferromagnetic layers are anti-parallel coupled from magnetostatic flux closure.

Since anti-ferromagnetic coupling is also generated by the magnetostatic fields of the layers in the MRAM structure, the spacer layer need not necessarily provide any additional antiferromagnetic coupling beyond eliminating the ferromagnetic coupling between the two magnetic layers.

The magnetic moment vectors in the two ferromagnetic layers 30, 32 and 60, 62 in each of the bits 18 and 20 of the MRAM device 12 may have different thicknesses or material to provide a resultant magnetic moment vector given by $\Box M_{\Box\Box}=(M_{84}-M_{82})$ $M_{\Box\Box}$, $M_{82}$, $M_{84}$ and a sub-layer moment fractional balance ratio, $$M_{br} = \frac{(M_{84} - M_{82})}{(M_{84} + M_{82})} = \frac{\Delta M_{86}}{M_{total}}.$$

The vectors in these equations are identified for simplification for bit 18 only. The equations would apply equally to bit 20. The resultant magnetic moment vector of the multilayer structures 22 and multilayer structure 52 is free to rotate with an applied magnetic field. In zero field the resultant magnetic moment vectors 86 and 94 will be stable in a direction, determined by the magnetic anisotropy, that is either parallel or anti-parallel with respect to the resultant magnetic moment vector of the pinned reference layer 42 or 72, respectively. It will be understood that the term "resultant magnetic moment vector" is used only for purposes of this description and for the case of totally balanced moments, the resultant magnetic moment vector can be zero in the absence of a magnetic field. As described below, only the sub-layer magnetic moment vectors 84 and 92 adjacent to the tunnel barrier determine the state of the bits 18 and 20, respectively.

The current through each of the bits 18 and 20 of the MRAM device 12 depends on the tunneling magnetoresistance, which is governed by the relative orientation of the magnetic moment vectors 84, 88 and 92, 96 of the free and pinned layers 32, 42 and 62, 72 directly adjacent to the tunneling barriers 24 and 54, respectively. If the magnetic moment vectors are parallel, then the bit resistance is low and a voltage bias will induce a larger current through the device 12. This state is defined as a "1". If the magnetic moment vectors are anti-parallel, then the bit resistance is high and an applied voltage bias will induce a smaller current through the device. This state is defined as a "0". It will be understood that these definitions are arbitrary and could be reversed, but are used in this example for illustrative purposes. Thus, in magnetoresistive memory, data storage is accomplished by applying magnetic fields that cause the magnetic moment vectors in the bit to be orientated either one of parallel and anti-parallel directions relative to the magnetic moment vector in the pinned reference layer.

Figure 2:
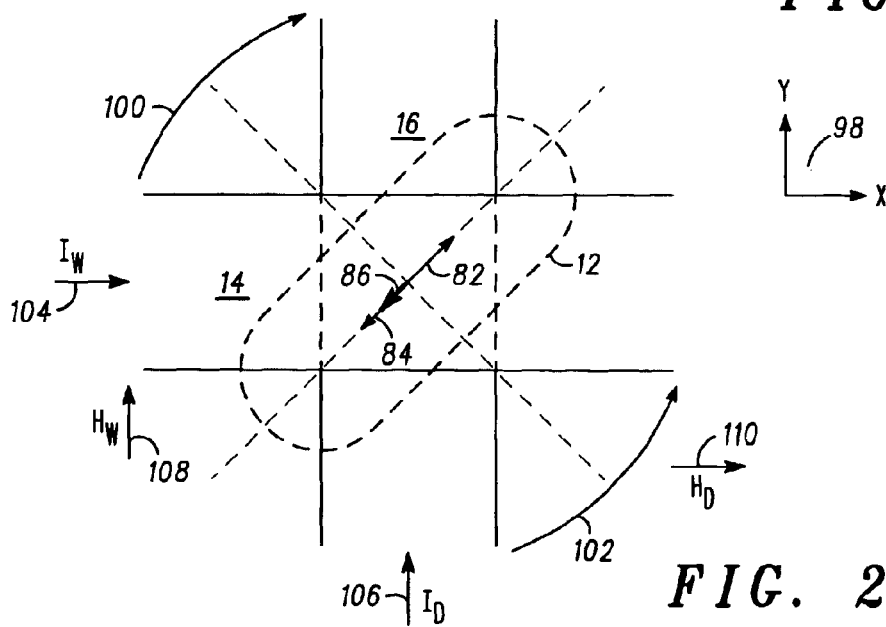
FIG. 2 is a simplified plan view of a magnetoresistive random access memory device illustrating magnetic vectors for a first bit in accordance with the first embodiment.

In the preferred embodiment, MRAM device 12 has tri-layer structures 22 and 52 and multilayer structures 26 and 56 that have a length/width ratio in a range of 1 to 5 for a non-circular plan as shown in FIG. 2. MRAM device 12 is elliptical in shape in the preferred embodiment because it is easier to use photolithographic processing to scale the device to smaller dimensions laterally. However, it will be understood that MRAM device 12 can have other shapes, such as square, circular, rectangular, or diamond, but is illustrated as being elliptical for simplicity and improved performance.

Further, during fabrication of MRAM array 10, each succeeding layer is deposited or otherwise formed in sequence and each MRAM device 12 may be defined by selective deposition, photolithography processing, etching, etc. in any of the techniques known in the semiconductor industry. During deposition of at least the ferromagnetic layers 30, 32, 60 and 62, a magnetic field is provided to set a preferred easy magnetic axis (induced anisotropy). The provided magnetic field creates a preferred anisotropy axis for magnetic moment vectors 82, 84, 90 and 92. The preferred axis is chosen to be at a 45° angle between word line 14 and digit line 16, as will be discussed presently.

Figure 3:
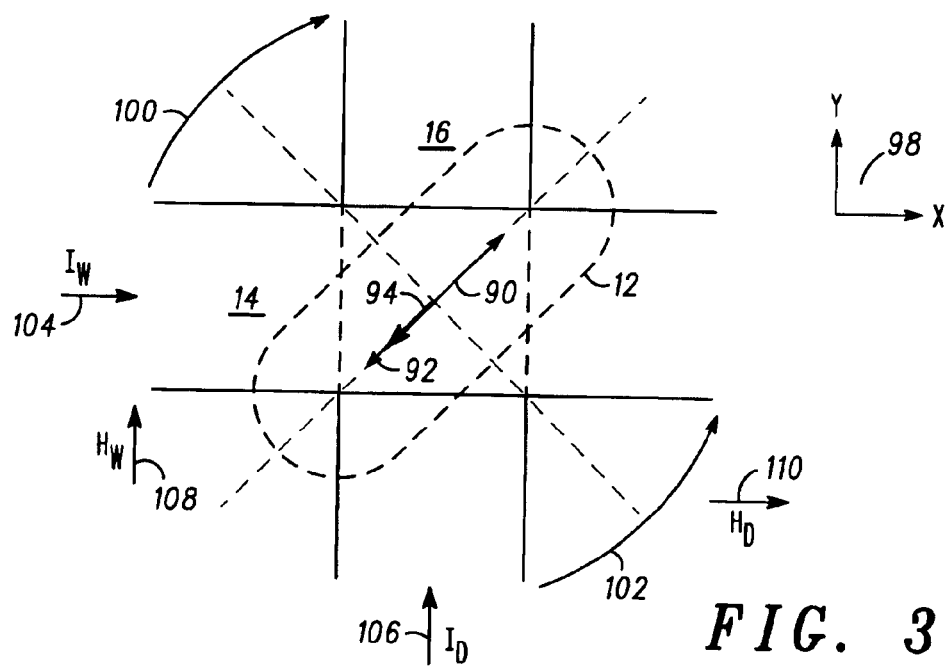
FIG. 3 is a simplified plan view of a magnetoresistive random access memory device illustrating magnetic vectors for a second bit in accordance with the first embodiment.

FIGS. 2 and 3 illustrate a simplified plan view of a MRAM array 10 in accordance with a preferred embodiment of the present invention. To simplify the description of MRAM device 12, all directions will be referenced to an x- and y-coordinate system 98 as shown and to a clockwise rotation direction 100 and a counter-clockwise rotation direction 102. The operation of bit 18 will be described, with region 22 having magnetic moment vectors 82 and 84, as well as resultant magnetic moment vector 86 as illustrated in FIG. 2. The vectors 90, 92, and 94 for bit 20 are illustrated in FIG. 3 and are of greater magnitude and therefore are illustrated as being longer than the vectors 82, 84, and 86 of FIG. 2. This greater magnitude is caused by the greater thicknesses of layers 60 and 62 in relation to layers 30 and 32. A greater magnitude could also be achieved by using different materials.

The following describes the vectors 82, 84, and 86 for bit 18, but it should be understood that bit 20 functions similarly. To illustrate how the writing methods work, it is assumed that a preferred anisotropy axis for magnetic moment vectors 82 and 84 is directed at a 45° angle relative to the negative x- and negative y-directions and at a 45° angle relative to the positive x- and positive y-directions. As an example, FIG. 2 shows that magnetic moment vector 84 is directed at a 45° angle relative to the negative x- and negative y-directions. Since magnetic moment vector 82 is generally oriented anti-parallel to magnetic moment vector 84, it is directed at a 45° angle relative to the positive x- and positive y-directions. This initial orientation will be used to show examples of the writing methods, as will be discussed presently.

In the preferred embodiment, a word current 104 is defined as being positive if flowing in a positive x-direction and a digit current 106 is defined as being positive if flowing in a positive y-direction. The purpose of word line 14 and digit line 16 is to create a magnetic field within MRAM device 12. A positive word current 104 will induce a circumferential word magnetic field, $H_W$ 108, and a positive digit current 106 will induce a circumferential digit magnetic field, $H_D$ 110. Since word line 14 is above MRAM device 12, in the plane of the element, $H_W$ 108 will be applied to MRAM device 12 in the positive y-direction for a positive word current 104. Similarly, since digit line 16 is below MRAM device 12, in the plane of the element, $H_D$ 110 will be applied to MRAM device 12 in the positive x-direction for a positive digit current 106. It will be understood that the definitions for positive and negative current flow are arbitrary and are defined here for illustrative purposes. The effect of reversing the current flow is to change the direction of the magnetic field induced within MRAM device 12. This behavior of a current induced magnetic field is well known to those skilled in the art.

As previously mentioned, bit 20 functions similarly to bit 18; however in this first embodiment as described, the tunnel barriers 24 and 54 are deposited with different thicknesses, giving a different resistance range for each bit 18 and 20, such as 2K and 4K ohms with MR of 50%. For example, $MR = \Box R/R_{low} = (R_{high} - R_{low})/R_{low}$. For 2 bits, 4 separate resistance states may be determined as shown in the chart below.

|  | BIT 2 (0) | BIT 2 (1) |
| --- | --- | --- |
| BIT 1 (0) | $R^1_{low} + R^2_{low}$ | $R^1_{high} + R^2_{low}$ |
| BIT 1 (1) | $R^1_{low} + R^2_{high}$ | $R^1_{high} + R^2_{high}$ |

Magnetic regions 22 and 52 are thus designed to provide a higher switching field either through the magnetic layer thickness, material anisotropy, or antiferromagnetic exchange strength. Bit 18 has a lower toggle field and can be switched when the applied field is above its threshold. Bit 20 has a higher switching threshold. In the field range above the bit 18 threshold and below the bit 20 threshold, bit 18 can be toggled without disturbing bit 20. For fields above the bit 20 threshold, both bit 18 and bit 20 will toggle. Therefore, after programming bit 20, bit 18 will need to be set to its desired value with lower fields.

Figure 4:
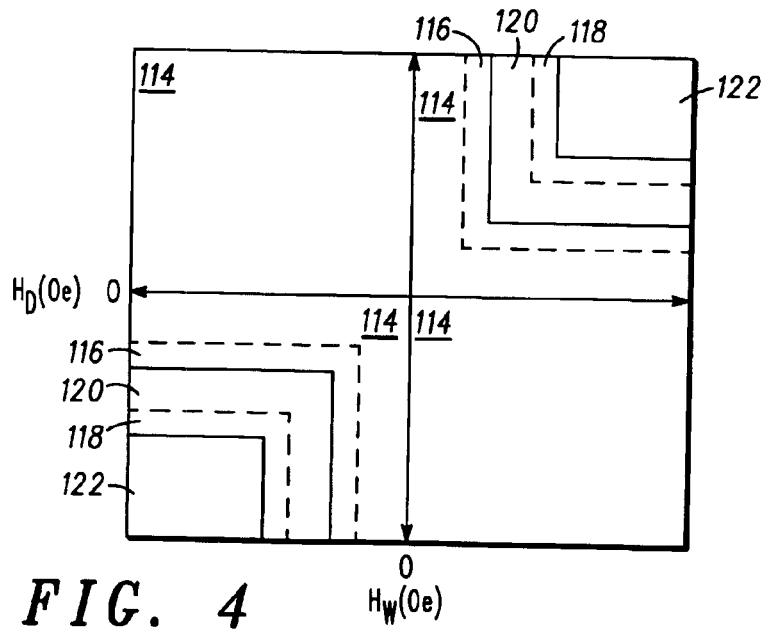
FIG. 4 is a schematic representation of the magnetic field amplitude combinations that produce the direct and toggle write modes in the magnetoresistive random access memory device in accordance with the first embodiment.
Figure 5:
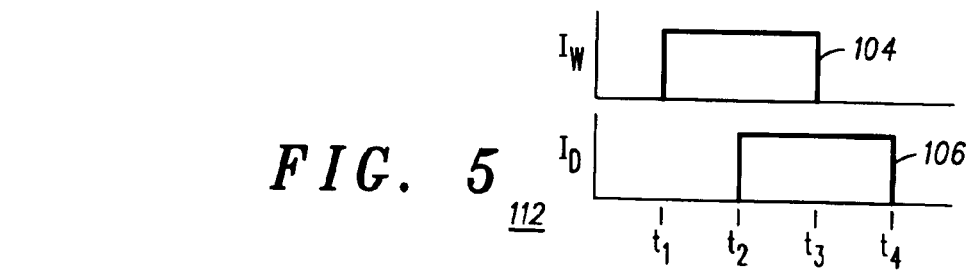

FIG. 4 illustrates a schematic representation of the switching behavior of a tri-layer structure 22 and 52 in accordance with the first embodiment. The x-axis is the word line magnetic field amplitude in Oersteds $H_W$, and the y-axis is the digit line magnetic field amplitude in Oersteds $H_D$. The magnetic fields are applied in a pulse sequence 112 as shown in FIG. 5 wherein pulse sequence 112 includes word current 104 and digit current 106 as functions of time.

The method of writing to each of the scalable bits 18 and 20 relies on the phenomenon of "spin-flop" for a nearly balanced SAF tri-layer structure. Here, the term "nearly balanced" is defined such that the magnitude of the sub-layer moment fractional balance ratio is in the range $0 \leq |M_{br}| \leq 0.1$. The spin-flop phenomenon lowers the total magnetic energy in an applied field by rotating the magnetic moment vectors of the ferromagnetic layers so that they are nominally orthogonal to the applied field direction but still predominantly anti-parallel to one another. The rotation, or flop, combined with a small deflection of each ferromagnetic magnetic moment vector in the direction of the applied field accounts for the decrease in total magnetic energy.

In general, using the flop phenomenon and a timed pulse sequence, the bits 18 and 20 can be written to using two distinct modes; a direct-write mode or a toggle-write mode. These modes are achieved using the same timed pulse sequence as will be described, but differ in the choice of magnetic sub-layer moment and polarity and magnitude of the magnetic field applied.

Each writing method has its advantages. For example, when using the direct write mode, there is no need to determine the initial state of the bit because the state is only switched if the state being written is different from the state that is stored. Although the direct writing method does not require knowledge of the state of the bit before the writing sequence is initiated, it does require changing the polarity of both the word and digit line depending on which state is desired.

When using the toggle writing method, there is a need to determine the initial state of the bit before writing because the state will be switched every time the same polarity pulse sequence is generated from both the word and digit lines. Thus, the toggle write mode works by reading the stored memory state and comparing that state with the new state to be written. After comparison, the bit is only written to if the stored state and the new state are different.

The bits 18 and 20 are constructed such that the magnetic anisotropy axis is ideally at a 45° angle to the word and digit lines 14 and 16. Hence, the magnetic moment vectors $M_{82,90}$ and $M_{84,92}$ are oriented in a preferred direction at a 45° angle to the directions of the word line and digit line at a time $t_0$. As an example of the writing method, to switch the state of the bits 18 and 20 using either a direct or toggle write, the following current pulse sequence is used. At a time $t_1$, the word current 104 is increased and $M_{82,90}$ and $M_{84,92}$ begin to rotate either clockwise or counterclockwise, depending on the direction of the word current 104, to align themselves nominally orthogonal to the field direction due to the spin-flop effect. At a time $t_2$, the digit current 106 is switched on. The digit current 106 flows in a direction such that $M_{82,90}$ and $M_{84,92}$ are further rotated in the same direction as the rotation caused by the digit line magnetic field $H_D$. At this point in time, both the word line current 104 and the digit line current 106 are on, with $M_{82,90}$ and $M_{84,92}$ being nominally orthogonal to the net magnetic field direction, which is 45° with respect to the current lines.

At a time $t_3$, the word line current 104 is switched off, so that $M_{82,90}$ and $M_{84,92}$ are being rotated only by the digit line magnetic field $H_D$. At this point, $M_{82,90}$ and $M_{84,92}$ have generally been rotated past their hard-axis instability points. At a time $t_4$, the digit line current 106 is switched off and $M_{82,90}$ and $M_{84,92}$ will align along the preferred anisotropy axis. At this point in time, $M_{82,90}$ and $M_{84,92}$ have been rotated 180° and the bits have been switched. Thus, by sequentially switching the word and digit currents 104 and 106 on and off, $M_{82,90}$ and $M_{84,92}$ of the bit can be rotated by 180° so that the state of the device is switched.

There are five regions of operation illustrated in FIG. 4 for the first embodiment which includes both a direct and a toggle mode. In a region 114 there is no switching, e.g., there is not sufficient current in either the word line 14 or digit line 16 to create a strong enough magnetic field to "write" the bits 18 and 20. For MRAM operation in a region 116 and 118, the direct writing method is in effect for writing bit 18, and bits 20 (while toggling 18), respectively. When using the direct writing method, there is no need to determine the initial state of the MRAM device because the state is only switched if the state being written is different from the state that is stored. The selection of the written state is determined by the direction of current in both word line 14 and digit line 16. For example, if a '1' is desired to be written, then the direction of current in all the lines will be positive. If a '1' is already stored in the element and a '1' is being written, then the final state of the MRAM device will continue to be a '1'. Further, if a '0' is stored and a '1' is being written with positive currents, then the final state of the MRAM device will be a '1'. Similar results are obtained when writing a '0' by using negative currents in both the word and digit lines. Hence, either state can be programmed to the desired '1' or '0' with the appropriate polarity of current pulses, regardless of its initial state.

For MRAM operation in regions 120 and 122, the toggle writing method is in effect. In region 120, bit 18 would be toggled and in region 122, both bits 18 and 20 would be toggled. When using the toggle writing method, there is a need to determine the initial state of the MRAM device before writing because the state is switched every time the MRAM device is written, regardless of the direction of the currents as long as the same polarity current pulses are chosen for both word line 14 and digit line 16. For example, if a '1' is initially stored then the state of the device will be switched to a '0' after one positive current pulse sequence is flowed through the word and digit lines. Repeating the positive current pulse sequence on the stored '0' state returns it to a '1'. Thus, to be able to write the memory element into the desired state, the initial state of MRAM device 10 must first be read and compared to the state to be written. The reading and comparing may require additional logic circuitry, including a buffer for storing information and a comparator for comparing memory states. MRAM device 10 is then written to only if the stored state and the state to be written are different. One of the advantages of this method is that the power consumed is lowered because only the differing bits are switched. An additional advantage of using the toggle writing method is that only uni-polar voltages are required and, consequently, smaller N-channel transistors can be used to drive the MRAM device.

Both writing methods involve supplying currents in word line 14 and digit line 16 such that magnetic moment vectors 82, 84, 90, and 92 can be oriented in one of two preferred directions as discussed previously.

Figure 6:
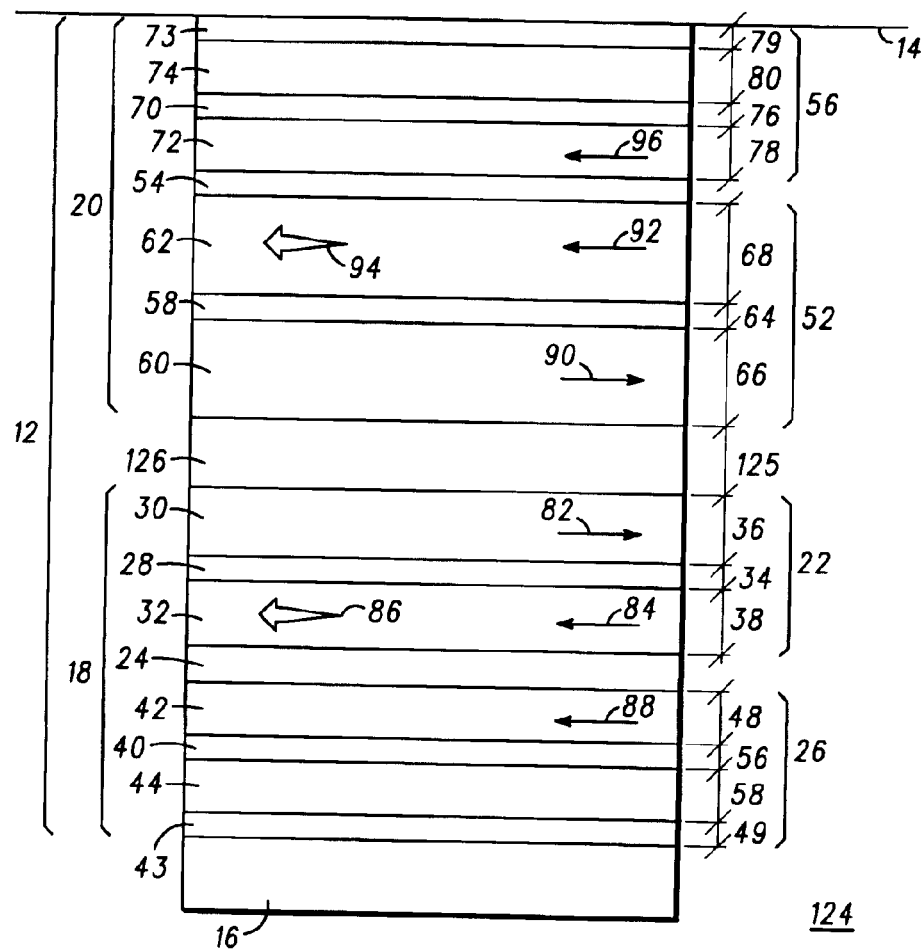
FIG. 6 is a simplified sectional view of a magnetoresistive random access memory device in accordance with a second embodiment.
Figure 7:
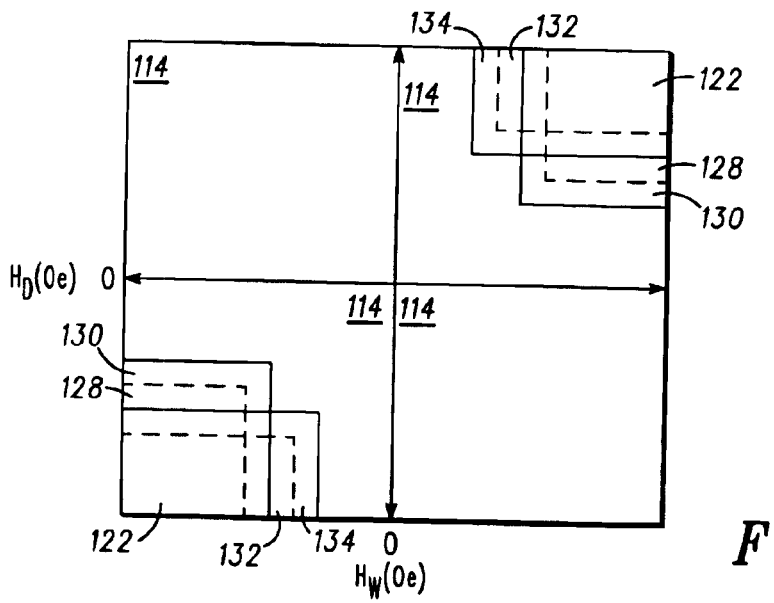
FIG. 7 is a graph illustrating a simulation of the magnetic field amplitude combinations that produce the direct and toggle write modes in the magnetoresistive random access memory device of the second embodiment.

FIG. 6 illustrates a simplified sectional view of a two bit MRAM device 124 in accordance with a second embodiment. The device 124 is similar to the device 10 of FIG. 1 except the conductive spacer 126 of the second embodiment is thicker than the conductive spacer 19 of the first embodiment. This larger thickness 125, for example 500 angstroms, allows for the individual writing of bits 18 and 20 (as shown in FIG. 7) since the digit line 16 is substantially further from bit 20 than bit 18 (the digit line 16 can affect bit 18 without affecting bit 20) and word line 14 is substantially further from bit 20 than bit 18 (the word line can affect bit 20 without affecting bit 18). Bit 18 may be written separately in the toggle write mode 128 and the direct write mode 130, and bit 20 may be written separately in the toggle write mode 132 and the direct write mode 134.

Therefore, relatively lower currents on word line 14 and digit line 16 would not write 114 either bit 18 or 20, while relative higher currents on word line 14 and digit line 16 would write 118, 122 both bits 18 and 20. A relative lower current on word line 14 and a relative higher current on digit line 16 would write 132, 134 bit 20, while a relative higher current on word line 14 and a relative lower current on digit line 16 would write 128, 130 bit 18.

Both the direct and toggle write modes may be used in the second embodiment as in the first embodiment. The bits 18 and 20 are constructed such that the magnetic anisotropy axis is ideally at a 45° angle to the word and digit lines 14 and 16. Hence, the magnetic moment vectors $M_{82,90}$ and $M_{84,92}$ are oriented in a preferred direction at a 45° angle to the directions of the word line and digit line at a time $t_0$ (FIG. 5). As an example of the writing method, to switch the state of the bits 18 and 20 using either a direct or toggle write, the following current pulse sequence is used. At a time $t_1$, the word current 104 is increased and $M_{82,90}$ and $M_{84,92}$ begin to rotate either clockwise or counterclockwise, depending on the direction of the word current 104, to align themselves nominally orthogonal to the field direction due to the spin-flop effect. At a time $t_2$, the digit current 106 is switched on. The digit current 106 flows in a direction such that $M_{82,90}$ and $M_{84,92}$ are further rotated in the same direction as the rotation caused by the digit line magnetic field $H_D$. At this point in time, both the word line current 104 and the digit line current 106 are on, with $M_{82,90}$ and $M_{84,92}$ being nominally orthogonal to the net magnetic field direction, which is 45° with respect to the current lines.

At a time $t_3$, the word line current 104 is switched off, so that $M_{82,90}$ and $M_{84,92}$ are being rotated only by the digit line magnetic field $H_D$. At this point, $M_{82,90}$ and $M_{84,92}$ have generally been rotated past their hard-axis instability points. At a time $t_4$, the digit line current 106 is switched off and $M_{82,90}$ and $M_{84,92}$ will align along the preferred anisotropy axis. At this point in time, $M_{82,90}$ and $M_{84,92}$ have been rotated 180° and the bits have been switched. Thus, by sequentially switching the word and digit currents 104 and 106 on and off, $M_{82,90}$ and $M_{84,92}$ of the bit can be rotated by 180° so that the state of the device is switched.

There are seven regions of operation illustrated in FIG. 7 for the second embodiment which includes both a direct and a toggle mode. In a region 114 there is no switching, e.g., there is not sufficient current in either the word line 14 or digit line 16 to create a strong enough magnetic field to "write" the bits 18 and 20. For MRAM operation in a regions 130 and 134, the direct writing method is in effect for writing bit 18 (region 130) and bit 20 (region 134). When using the direct writing method, there is no need to determine the initial state of the MRAM device because the state is only switched if the state being written is different from the state that is stored. The selection of the written state is determined by the direction of current in both word line 14 and digit line 16. For example, if a '1' is desired to be written, then the direction of current in all the lines will be positive. If a '1' is already stored in the element and a '1' is being written, then the final state of the MRAM device will continue to be a '1'. Further, if a '0' is stored and a '1' is being written with positive currents, then the final state of the MRAM device will be a '1'. Similar results are obtained when writing a '0' by using negative currents in both the word and digit lines. Hence, either state can be programmed to the desired '1' or '0' with the appropriate polarity of current pulses, regardless of its initial state.

For MRAM operation in regions 122 (bits 18 and 22), 128 (bit 18) and 132 (bit 20), the toggle writing method is in effect. When using the toggle writing method, there is a need to determine the initial state of the MRAM device before writing because the state is switched every time the MRAM device is written, regardless of the direction of the currents as long as the same polarity current pulses are chosen for both word line 14 and digit line 16. For example, if a '1' is initially stored then the state of the device will be switched to a '0' after one positive current pulse sequence is flowed through the word and digit lines. Repeating the positive current pulse sequence on the stored '0' state returns it to a '1'. Thus, to be able to write the memory element into the desired state, the initial state of MRAM device 10 must first be read and compared to the state to be written. The reading and comparing may require additional logic circuitry, including a buffer for storing information and a comparator for comparing memory states. MRAM device 10 is then written to only if the stored state and the state to be written are different. One of the advantages of this method is that the power consumed is lowered because only the differing bits are switched. An additional advantage of using the toggle writing method is that only uni-polar voltages are required and, consequently, smaller N-channel transistors can be used to drive the MRAM device.

Both writing methods involve supplying currents in word line 14 and digit line 16 such that magnetic moment vectors 82, 84, 90, and 92 can be oriented in one of two preferred directions as discussed previously.

Figure 8:
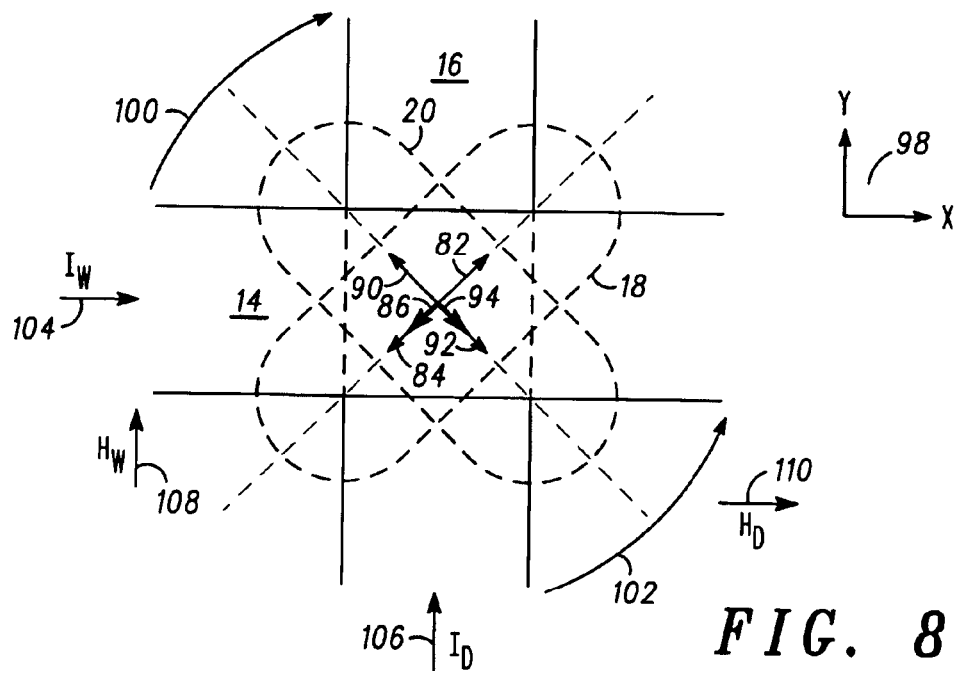
FIG. 8 is a simplified plan view of a magnetoresistive random access memory device illustrating magnetic vectors in accordance with a third embodiment.

A third embodiment of the invention allows for the programming of the bits 18 and 20 separately using the same magnitudes of the currents in the word line 14 and the digit line 16. This third embodiment uses a structure similar to that illustrated in FIG. 1, except bits 18 and 20 are patterned separately with an orthogonal orientation of their long axes as shown in FIG. 8. Bit 18 is oriented at +45 degrees and bit 20 is oriented at minus 45 degrees. Therefore, bits 18 and 20 are completely independently programmable with no disturb mechanism.

For bit 18, ferromagnetic layers 30 and 32 each have a magnetic moment vector 82 and 84, respectively, that are usually held anti-parallel by coupling of the anti-ferromagnetic coupling spacer layer 28. Also, magnetic region 22 has a resultant magnetic moment vector 86 and magnetic region 26 has a resultant magnetic moment vector 88. Resultant magnetic moment vectors 86 and 88 are oriented along an anisotropy easy-axis in a direction that is at an angle, preferably 45°, from word line 14 and digit line 16 (See FIG. 2). Further, magnetic region 22 is a free ferromagnetic region, meaning that resultant magnetic moment vector 86 is free to rotate in the presence of an applied magnetic field. Magnetic region 26 is a pinned ferromagnetic region, meaning that resultant magnetic moment vector 88 is not free to rotate in the presence of a moderate applied magnetic field and is used as the reference layer.

For bit 20, ferromagnetic layers 60 and 62 each have a magnetic moment vector 90 and 92, respectively, that are usually held anti-parallel by coupling of the anti-ferromagnetic coupling spacer layer 58. Also, magnetic region 52 has a resultant magnetic moment vector 94 and magnetic region 56 has a resultant magnetic moment vector 96. Resultant magnetic moment vectors 94 and 96 are oriented along an anisotropy easy-axis in a direction that is at an angle, preferably –45°, from word line 14 and digit line 16 (See FIG. 8). Further, magnetic region 52 is a free ferromagnetic region, meaning that resultant magnetic moment vector 94 is free to rotate in the presence of an applied magnetic field. Magnetic region 56 is a pinned ferromagnetic region, meaning that resultant magnetic moment vector 96 is not free to rotate in the presence of a moderate applied magnetic field and is used as the reference layer.

Figure 9:
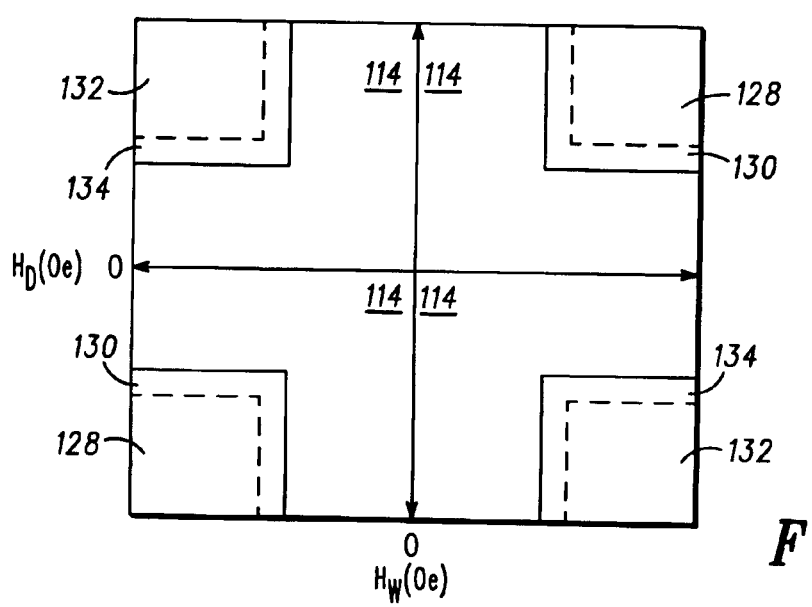
FIG. 9 is a graph illustrating a simulation of the magnetic field amplitude combinations that produce the direct and toggle write modes in the magnetoresistive random access memory device in accordance with the third embodiment.

This different orientation allows for the writing of the bits 18 and 20 in different quadrants as illustrated in FIG. 9. Bit 18 may be programmed 128, 130 (toggle or direct mode, respectively) when Hw 108 and Hd 110 are both positive or both negative. Bit 20 may be programmed 132, 134 (toggle or direct mode, respectively) when Hw 108 is positive and Hd 110 is negative, or when Hw 108 is negative and Hd 110 is positive. This allows for the independent programming of either bit by choice of polarity of the word line 14 or digit line 16.

The bits 18 and 20 are constructed such that the magnetic anisotropy axis is ideally at a 45° angle to the word and digit lines 14 and 16 and perpendicular to each other. Hence, the magnetic moment vectors $M_{82,90}$ and $M_{84,92}$ are oriented in a preferred direction, one each, at a 45° angle and a −45° angle to the directions of the word line and digit line at a time $t_0$. As an example of the writing method, to switch the state of the bits 18 and 20 using either a direct or toggle write, the following current pulse sequence is used. At a time $t_1$, the word current 104 is increased and $M_{82,90}$ and $M_{84,92}$ begin to rotate either clockwise or counterclockwise, depending on the direction of the word current 104, to align themselves nominally orthogonal to the field direction due to the spin-flop effect. At a time $t_2$, the digit current 106 is switched on. The digit current 106 flows in a direction such that $M_{82,90}$ and $M_{84,92}$ are further rotated in the same direction as the rotation caused by the digit line magnetic field $H_D$. At this point in time, both the word line current 104 and the digit line current 106 are on, with $M_{82,90}$ and $M_{84,92}$ being nominally orthogonal to the net magnetic field direction, which is 45° with respect to the current lines.

At a time $t_3$, the word line current 104 is switched off, so that $M_{82,90}$ and $M_{84,92}$ are being rotated only by the digit line magnetic field $H_D$. At this point, $M_{82,90}$ and $M_{84,92}$ have generally been rotated past their hard-axis instability points. At a time $t_4$, the digit line current 106 is switched off and $M_{82,90}$ and $M_{84,92}$ will align along the preferred anisotropy axis. At this point in time, $M_{82,90}$ and $M_{84,92}$ have been rotated 180° and the bits have been switched. Thus, by sequentially switching the word and digit currents 104 and 106 on and off, $M_{82,90}$ and $M_{84,92}$ of the bit can be rotated by 180° so that the state of the device is switched.

There are five regions of operation illustrated in FIG. 9 for the third embodiment which includes both a direct and a toggle mode. In a region 114 there is no switching, e.g., there is not sufficient current in either the word line 14 or digit line 16 to create a strong enough magnetic field to "write" the bits 18 and 20. For MRAM operation in a region 130 and 134, the direct writing method is in effect for writing bit 18, and bits 18 and 20, respectively. When using the direct writing method, there is no need to determine the initial state of the MRAM device because the state is only switched if the state being written is different from the state that is stored. The selection of the written state is determined by the direction of current in both word line 14 and digit line 16. For example, if a '1' is desired to be written, then the direction of current in all the lines will be positive. If a '1' is already stored in the element and a '1' is being written, then the final state of the MRAM device will continue to be a '1'. Further, if a '0' is stored and a '1' is being written with positive currents, then the final state of the MRAM device will be a '1'. Similar results are obtained when writing a '0' by using negative currents in both the word and digit lines. Hence, either state can be programmed to the desired '1' or '0' with the appropriate polarity of current pulses, regardless of its initial state.

For MRAM operation in regions 128 and 132, the toggle writing method is in effect for bits 18 and 20, respectively. When using the toggle writing method, there is a need to determine the initial state of the MRAM device before writing because the state is switched every time the MRAM device is written, regardless of the direction of the currents as long as the same polarity current pulses are chosen for both word line 14 and digit line 16. For example, if a '1' is initially stored then the state of the device will be switched to a '0' after one positive current pulse sequence is flowed through the word and digit lines. Repeating the positive current pulse sequence on the stored '0' state returns it to a '1'. Thus, to be able to write the memory element into the desired state, the initial state of MRAM device 10 must first be read and compared to the state to be written. The reading and comparing may require additional logic circuitry, including a buffer for storing information and a comparator for comparing memory states. MRAM device 10 is then written to only if the stored state and the state to be written are different. One of the advantages of this method is that the power consumed is lowered because only the differing bits are switched. An additional advantage of using the toggle writing method is that only uni-polar voltages are required and, consequently, smaller N-channel transistors can be used to drive the MRAM device.

Both writing methods involve supplying currents in word line 14 and digit line 16 such that magnetic moment vectors 82, 84, 90, and 92 can be oriented in one of two preferred directions as discussed previously.

Various changes and modifications to the embodiments herein chosen for purposes of illustration will readily occur to those skilled in the art. To the extent that such modifications and variations do not depart from the spirit of the invention, they are intended to be included within the scope thereof which is assessed only by a fair interpretation of the following claims.

In the foregoing specification, the invention has been described with reference to specific exemplary embodiments; however, it will be appreciated that various modifications and changes may be made without departing from the scope of the present invention as set forth in the claims below. The specification and figures are to be regarded in an illustrative manner, rather than a restrictive one and all such modifications are intended to be included within the scope of the present invention.

As used herein, the terms "comprises", "comprising", or any variation thereof, are intended to reference a non-exclusive inclusion, such that a process, method, article, composition or apparatus that comprises a list of elements does not include only those elements recited, but may also include other elements not expressly listed or inherent to such process, method, article, composition or apparatus.

What is claimed is:

1. A method for programming a memory cell having two bits positioned between two current conductors comprising:
    toggling the logic state of the two bits; and
    toggling the logic state of one of the two bits.

2. The method of programming a memory cell as claimed in claim 1 further comprising reading the two bits to obtain stored information and comparing the stored information to program information to be written prior to toggling the two bits.

3. A method for programming a memory cell having two bits positioned between two current conductors comprising:
    toggling a logic state of a first of the two bits; and
    toggling a logic state of a second of the two bits independently of toggling the logic state of the first of the two bits.

4. The method of programming a memory cell as claimed in claim 3 further comprising reading the two bits to obtain stored information and comparing the stored information to program information to be written prior to toggling each of the two bits.

5. A method for programming a memory cell having two bits positioned between first and second current conductors comprising:
    deciding on one of or both of the steps comprising:
        applying current to each of the conductors, thereby toggling the logic state of the two bits; and
        applying a smaller current to each of the conductors, thereby toggling the logic state of only one of the bits.

6. The method of programming a memory cell as claimed in claim 5 further comprising reading the two bits to obtain stored information and comparing the stored information to the information to be written prior to setting the logic state of the two bits.

7. A method for programming a memory cell having first and second bite positioned between first and second current conductors, comprising:

deciding on one of the steps comprising:
programming the first and second bits by applying first and second currents to the first and second current conductors, respectively;
programming the first bit to switch a state of the first bit by applying the second current to the second conductor and a third current to the first conductor, the third current being less in magnitude than the first current; and
programming the second bit to switch a state of the second bit by applying the first current to the first conductor and a fourth current to the second conductor, the fourth current being less in magnitude than the second current.

8. The method of programming a memory cell as claimed in claim 7 further comprising reading the two bits to obtain stored information and comparing the stored information to the information to be written prior to programming.

9. A method for programming a memory cell having first and second bits positioned between first and second current conductors comprising:
programming the first bit to toggle its present bit state by applying one of a positive current in both the first and second current conductors or a negative current in both the first and second current conductors; and
programming the second bit to toggle its present bit state by applying a positive current in one of the first and second current conductors and a negative current in the other of the first and second current conductors.

10. The method of programming a memory cell as claimed in claim 9 further comprising reading the two bits to obtain stored information and comparing the stored information to program information to be written prior to programming each of the first and second bits.

11. A method of switching a magnetoresistive memory device having a magnetoresistive memory element adjacent to a first conductor and a second conductor wherein the magnetoresistive memory element comprises first and second bits, the first bit including a first magnetic region and a second magnetic region separated by a first tunneling barrier, the second bit including a third magnetic region and a fourth magnetic region separated by a second tunneling barrier, at least one of the first and second magnetic regions and at least one of the third and fourth magnetic regions include N ferromagnetic material layers that are antiferromagnetically coupled, where N is an integer equal to at least two, and where each layer has a magnetic moment adjusted to provide a writing mode, and also each of the first, second, third and fourth magnetic regions has a magnetic moment vector oriented in a preferred direction at a time t0, the method comprising:
turning on a first current flow through the first conductor at a time t1;
turning on a second current flow through the second conductor at a time t2;
turning off the first current flow through the first conductor at a time t3; and
turning off the second current flow through the second conductor at a time t4 so that one of the magnetic moment vectors for each of the first and second bits is oriented in a direction different from the initial preferred direction at the time t0.

12. The method of switching a magnetoresistive memory device as claimed in claim 11 wherein the magnetic moment of each layer of the N layers is set to provide a direct write mode at an operating current such that the current in each of the first and second conductors is pulsed with a same polarity to write a state and the current in each of the first and second conductors is pulsed with an opposite polarity to reverse the state.

13. The method of switching a magnetoresistive memory device as claimed in claim 12 wherein the time t3 is approximately equal to t4 so that the magnetoresistive memory device operates in the direct write mode at the operating current.

14. The method of switching a magnetoresistive memory device as claimed in claim 13 wherein the time t1 is approximately equal to t2 so that the magnetoresistive memory device operates in the direct write mode at the operating current.

15. The method of switching a magnetoresistive memory device as claimed in claim 11 wherein the magnetic moment of each layer of the N layers is set to provide a toggle write mode at an operating current such that the current in each of the first and second conductors is pulsed with a same polarity to write a state and the current in each of the first and second conductors is pulsed with the same polarity to reverse the state.

16. The method of switching a magnetoresistive memory device as claimed in claim 15 including in addition steps of reading the magnetoresistive memory device to obtain stored information and comparing the stored information to program information to be written prior to the step of turning on the first current flow.

* * * * *